(12) United States Patent
Childress et al.

(10) Patent No.: US 8,514,525 B2
(45) Date of Patent: Aug. 20, 2013

(54) CURRENT-PERPENDICULAR-TO-THE-PLANE (CPP) MAGNETORESISTIVE (MR) SENSOR WITH REFERENCE LAYER INTEGRATED IN MAGNETIC SHIELD

(75) Inventors: Jeffrey R. Childress, San Jose, CA (US); Jordan Asher Katine, Mountain View, CA (US); Manfred Ernst Schabes, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 226 days.

(21) Appl. No.: 12/881,162

(22) Filed: Sep. 13, 2010

(65) Prior Publication Data

US 2012/0063035 A1    Mar. 15, 2012

(51) Int. Cl.
G11B 5/10    (2006.01)
G11B 5/39    (2006.01)

(52) U.S. Cl.
USPC ............... 360/319; 360/324.12; 360/324.2

(58) Field of Classification Search
USPC .................. 360/319, 324.2, 314, 324.12
See application file for complete search history.

(56) References Cited

U.S. PATENT DOCUMENTS

| | | | |
|---|---|---|---|
| 5,390,061 A | 2/1995 | Nakatani et al. | |
| 6,005,753 A | 12/1999 | Fontana, Jr. et al. | |
| 7,072,154 B2 | 7/2006 | Gill et al. | |
| 7,615,996 B1 * | 11/2009 | Machita et al. | 324/252 |
| 2005/0073778 A1 * | 4/2005 | Hasegawa et al. | 360/324.11 |
| 2005/0280958 A1 * | 12/2005 | Saito et al. | 360/324.12 |
| 2007/0030603 A1 * | 2/2007 | Sato et al. | 360/324 |
| 2009/0135529 A1 | 5/2009 | Shimazawa et al. | |
| 2009/0190272 A1 | 7/2009 | Machita et al. | |
| 2010/0039734 A1 * | 2/2010 | Hara et al. | 360/319 |
| 2010/0067148 A1 * | 3/2010 | Tsuchiya et al. | 360/319 |
| 2010/0079917 A1 * | 4/2010 | Miyauchi et al. | 360/319 |
| 2010/0103562 A1 | 4/2010 | Machita et al. | |
| 2011/0013317 A1 * | 1/2011 | Kaiser et al. | 360/324.11 |
| 2011/0069417 A1 * | 3/2011 | Kawamori et al. | 360/319 |

FOREIGN PATENT DOCUMENTS

JP    2007048388    2/2007

* cited by examiner

Primary Examiner — Craig A. Renner
(74) Attorney, Agent, or Firm — Thomas R. Berthold (57) ABSTRACT

A current-perpendicular-to-the-plane magnetoresistive (CPP MR) sensor has a shield layers that also functions as the sensor's reference layer. In a CPP MR disk drive read head, the shield layer has a fixed magnetization oriented substantially parallel to the air-bearing surface (ABS) of the slider that supports the read head. The quiescent magnetization of the sensor free layer is oriented at an angle relative to the magnetization of the shield layer, preferably between 120 and 150 degrees, to optimize the sensor response to magnetic fields from the recorded data bits on the disk. The magnetization of the free layer is biased by a biasing structure that includes a ferromagnetic side biasing layer formed near the side edges of the free layer and a ferromagnetic back biasing layer that is recessed from the ABS and has a magnetization oriented generally orthogonal to the ABS.

22 Claims, 5 Drawing Sheets

CURRENT-PERPENDICULAR-TO-THE-PLANE (CPP) MAGNETORESISTIVE (MR) SENSOR WITH REFERENCE LAYER INTEGRATED IN MAGNETIC SHIELD

BACKGROUND OF THE INVENTION

1. Field of the Invention

The invention relates generally to a current-perpendicular-to-the-plane (CPP) magnetoresistive (MR) sensor that operates with the sense current directed perpendicularly to the planes of the layers making up the sensor stack.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field is detectable as a change in electrical resistance. If the sense current is directed perpendicularly through the planes of the layers in the sensor stack, the sensor is referred to as current-perpendicular-to-the-plane (CPP) sensor.

In addition to CPP-GMR read heads, another type of CPP sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu or Ag. In a CPP-TMR read head the nonmagnetic spacer layer is formed of an electrically insulating material, such as $TiO_2$, MgO or $Al_2O_3$.

The CPP MR sensors described above are "single" CPP sensors because they have a single spacer layer and a single reference layer. A "dual" CPP MR sensor has a second spacer layer and a second reference layer located on the other side of the free layer, i.e., the side opposite the first spacer layer and first reference layer. Dual CPP MR sensors are well-known in the art and have been proposed to provide an increased magnetoresistance ($\Delta R/R$) over single CPP MR sensors. Single CPP MR sensors are known to be susceptible to current-induced noise and instability. The spin-polarized current flows perpendicularly through the ferromagnetic layers and produces a spin transfer torque on the local magnetization. This can produce continuous gyrations of the magnetization, resulting in substantial magnetic noise if the sense current is above a certain level. It has been demonstrated that dual CPP-GMR sensors may reduce the sensitivity of the free layer to spin-torque-induced instability. (J. R. Childress et al., "Dual current-perpendicular-to-plane giant magnetoresistive sensors for magnetic recording heads with reduced sensitivity to spin-torque-induced noise", *J. Appl. Phys.* Vol. 99, 08S305, 2006).

The sensor stack in a CPP MR read head is located between two shields of magnetically permeable material that shield the read head from recorded data bits that are neighboring the data bit being read. As the data density increases in magnetic recording disk drives, the read head dimensions decrease. In particular, the flux from the neighboring bits in the along-the-track direction needs to be shielded in to improve the spatial resolution of the sensor. This requires that the sensor stack be thinner, and also that the shield-to-shield spacing be reduced. However, it becomes difficult to reduce the thickness of the free and reference ferromagnetic layer without a significant reduction in the sensed signal. It is also difficult to reduce the thickness of the antiferromagnetic layer without losing magnetic stability in the reference layer.

What is needed is a CPP MR sensor with significantly reduced shield-to-shield spacing that does not suffer from reduced signal reduction or reduced magnetic stability.

SUMMARY OF THE INVENTION

The invention relates to a single or dual CPP MR sensor wherein at least one of the shield layers also functions as the reference layer with an in-plane magnetization in the absence of an external magnetic field. The shield layer with integrated reference layer having a fixed magnetization may have similar dimensions to a conventional shield layer, but preferably has smaller dimensions and an elongated aspect ratio to improve the magnetic characteristics of the sensor. The shield layer may have its magnetization fixed by being exchange-coupled to an antiferromagnetic layer. In a CPP MR disk drive read head, the shield layer has a fixed magnetization oriented substantially parallel to the air-bearing surface (ABS) of the slider that supports the read head. The quiescent magnetization of the sensor free layer is oriented at an angle relative to the magnetization of the shield layer, preferably between 120 and 150 degrees, to optimize the sensor response to magnetic fields from the recorded data bits on the disk. The magnetization of the free layer is biased by a biasing structure that includes a ferromagnetic side biasing layer formed near the side edges of the free layer and a ferromagnetic back biasing layer that is recessed from the ABS and has a magnetization oriented generally orthogonal to the ABS. The sensor may also include an optional magnetic interface layer between the shield layer and the sensor's nonmagnetic spacer layer.

For a fuller understanding of the nature and advantages of the present invention, reference should be made to the following detailed description taken together with the accompanying figures.

DETAILED DESCRIPTION OF THE INVENTION

Figure 1:
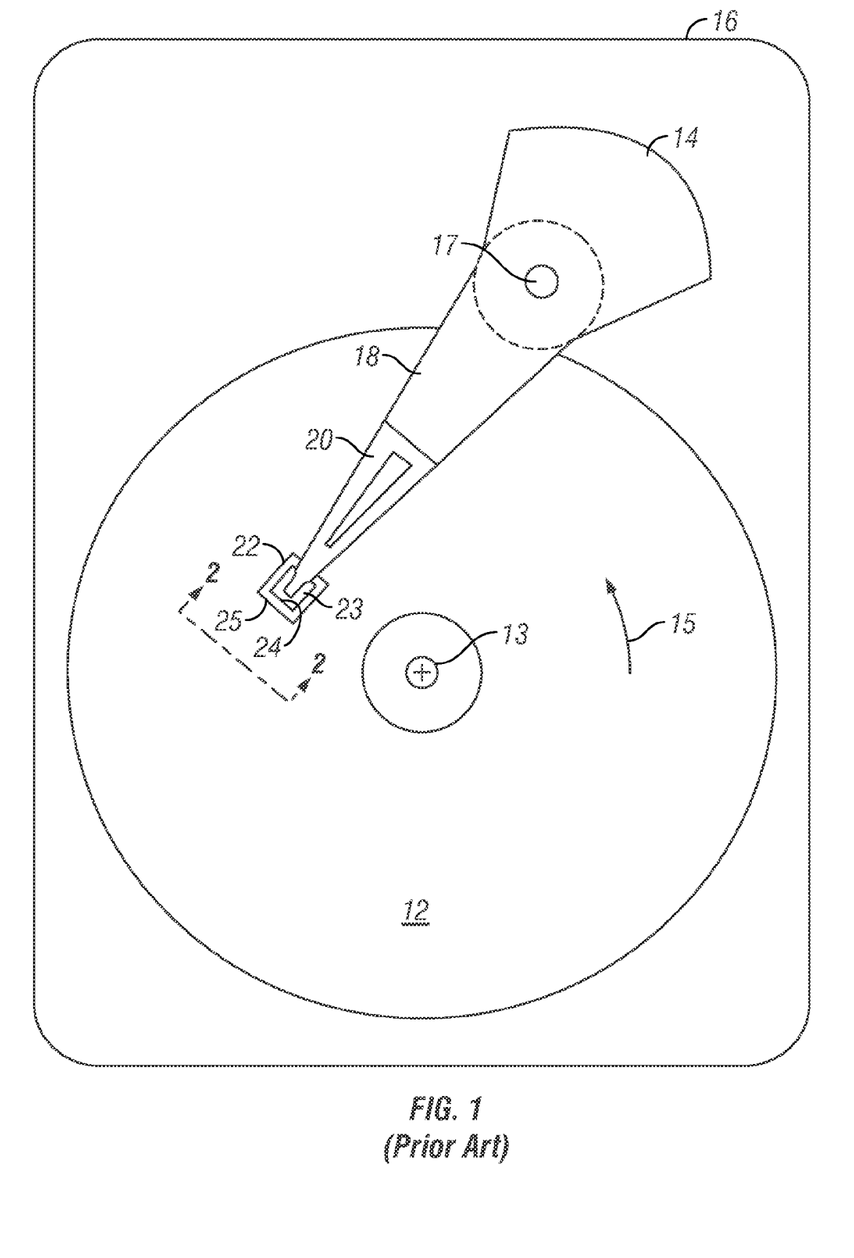
FIG. 1 is a schematic top view of a conventional magnetic recording hard disk drive with the cover removed.

The CPP magnetoresistive (MR) sensor of this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
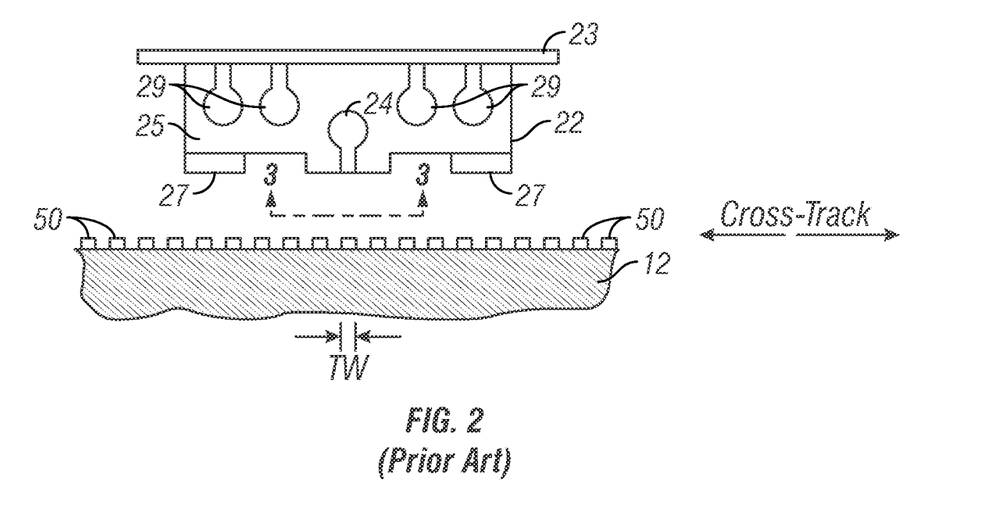
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
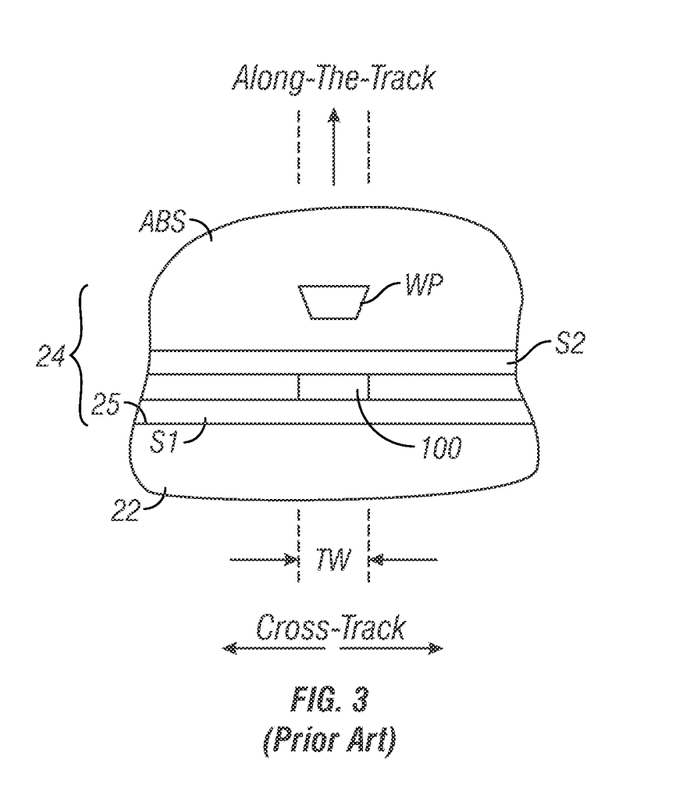
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
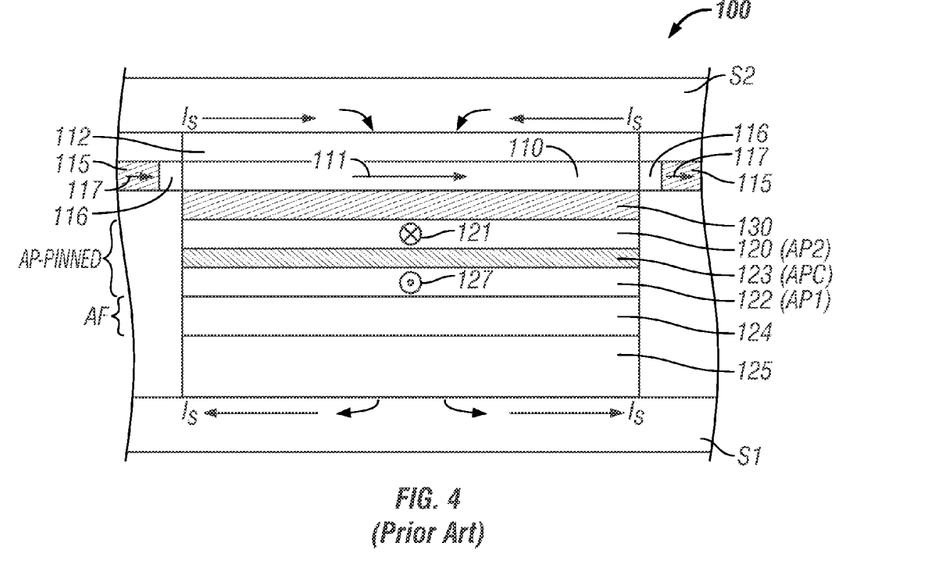
FIG. 4 is a cross-sectional schematic view of a prior art single CPP MR read head showing the stack of layers located between the magnetic shield layers.

FIG. 4 is an enlarged sectional view showing the layers making up sensor 100 as would be viewed from the disk. Sensor 100 is a CPP MR read head comprising a stack of layers formed between the two magnetic shield layers S1, S2 that are typically electroplated NiFe alloy films. The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110.

The pinned ferromagnetic layer in a CPP MR sensor may be a single pinned layer or an antiparallel (AP) pinned structure like that shown in FIG. 4. An AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's electrically nonmagnetic spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. Instead of being in contact with a hard magnetic layer, AP1 by itself can be comprised of hard magnetic material so that AP1 is in contact with an underlayer on one side and the nonmagnetic APC layer on the other side. The AP-pinned structure minimizes the net magnetostatic coupling between the reference/pinned layers and the CPP MR free ferromagnetic layer. The AP-pinned structure, also called a "laminated" pinned layer, and sometimes called a synthetic antiferromagnet (SAF), is described in U.S. Pat. No. 5,465,185.

The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. Alternatively, the AP-pinned structure may be "self-pinned" or it may be pinned by a hard magnetic layer such as $Co_{100-x}Pt_x$ or $Co_{100-x-y}Pt_xCr_y$ (where x is about between 8 and 30 atomic percent). Instead of being in contact with a hard magnetic layer, AP1 layer 122 by itself can be comprised of hard magnetic material so that it is in contact with an underlayer on one side and the nonmagnetic APC layer 123 on the other side. In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net magnetization of the AP-pinned structure, remains high. In the case of a hard magnet pinning layer, the hard magnet pinning layer moment needs to be accounted for when balancing the moments of AP1 and AP2 to minimize magnetostatic coupling to the free layer.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta or a Cu/Ru/Ta trilayer.

A ferromagnetic biasing layer 115, such as a CoPt or CoCrPt hard magnetic bias layer, is also typically formed outside of the sensor stack near the side edges of the free ferromagnetic layer 110. The biasing layer 115 is electrically insulated from free layer 110 by insulating regions 116, which may be formed of alumina, for example. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110. The ferromagnetic biasing layer 115 may be a hard magnetic bias layer or a ferromagnetic layer that is exchange-coupled to an antiferromagnetic layer.

Figure 5:
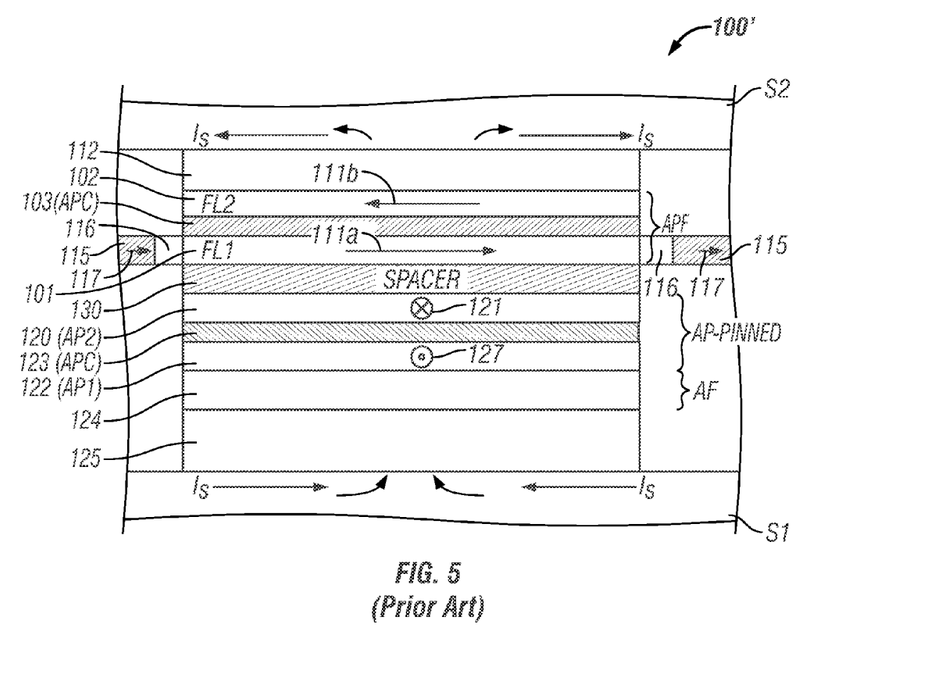
FIG. 5 is a cross-sectional schematic view of a prior art single CPP MR read head having an antiparallel-free (APF) structure as the free layer and showing the stack of layers located between the magnetic shield layers.

The free layer 110 in FIG. 4 is a "single" free ferromagnetic layer, meaning that it may be a single layer or multiple or laminated layers but with a single magnetization 111. However, alternatively the free layer may be the well-known antiparallel free (APF) structure, as shown in FIG. 5. FIG. 5 is an enlarged sectional view showing the layers making up a sensor 100', which is identical to sensor 100 in FIG. 4 except that the free layer 110 is replaced with an APF structure. The APF structure comprises a first free ferromagnetic layer 101 (FL1), second free ferromagnetic layer 102 (FL2), and an antiparallel (AP) coupling (APC) layer 103. APC layer 103, such as a thin (between about 4 Å and 10 Å) Ru film, couples FL1 and FL2 together antiferromagnetically with the result that FL1 and FL2 maintain substantially antiparallel magnetization directions, as shown by arrows 111a, 111b, respectively. The antiferromagnetically-coupled FL1 and FL2 rotate together in the presence of a magnetic field, such as the magnetic fields from data recorded in a magnetic recording medium. The net magnetic moment/area of the APF structure (represented by the difference in magnitudes of arrows 111a, 111b) is (M1*t1−M2*t2), where M1 and t1 are the saturation magnetization and thickness, respectively, of FL1, and M2 and t2 are the saturation magnetization and thickness, respectively, of FL2. Thus the thicknesses of FL1 and FL2 are chosen to obtain the desired net free layer magnetic moment for the sensor. Also, the ferromagnetic biasing layer 115, such as a CoPt or CoCrPt hard magnetic bias layer, is also typically formed outside of the sensor stack, but near the side edges of FL1. The biasing layer 115 is electrically insulated from FL1 by insulating regions 116, which may be formed of alumina, for example.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top shield S2 perpendicularly through the sensor stack to bottom shield S1, the magnetic fields from the recorded data on the disk will cause rotation of the free-layer magnetization 111 relative to the reference-layer magnetization 121, which is detectable as a change in electrical resistance.

Figure 6:
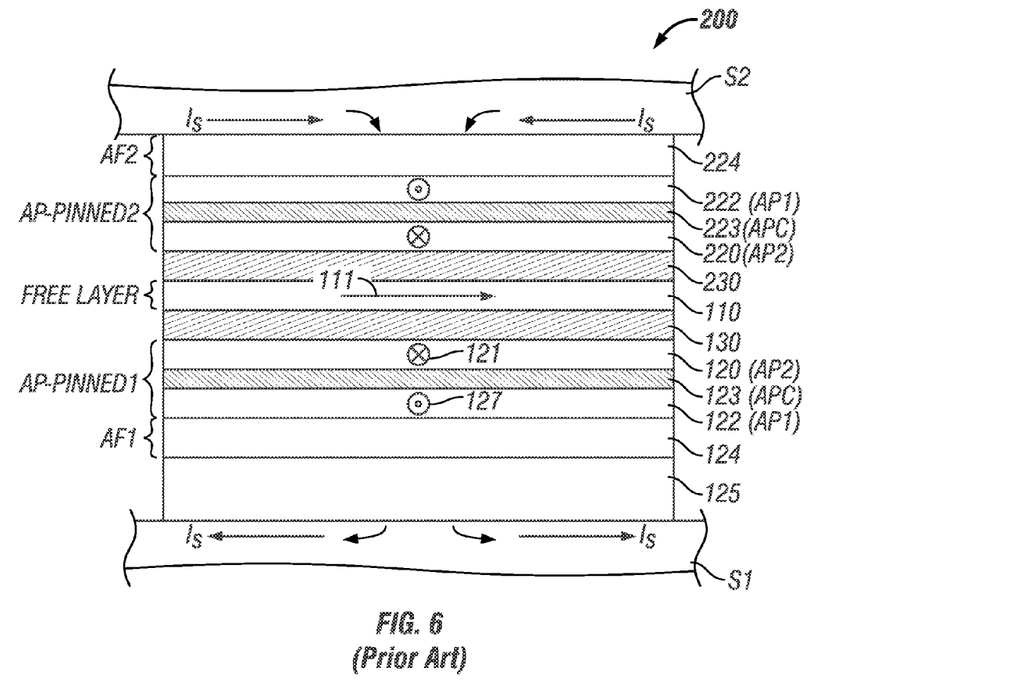
FIG. 6 is a cross-sectional schematic view a prior art dual CPP MR read head showing the stack of layers located between the magnetic shield layers.

FIG. 6 is a sectional view showing the layers making up a dual CPP MR sensor 200 based on the "single" CPP MR sensor of FIG. 4. Dual CPP MR sensors are well-known in the art and have been proposed to provide an increased magnetoresistance (ΔR/R) over single CPP MR sensors. Also, single CPP MR sensors are known to be susceptible to current-induced noise and instability. The spin-polarized electron current flows perpendicularly through the ferromagnetic layers and exerts a torque on the local magnetization due to the spin-transfer effect. This spin-torque induced excitation of the magnetization can result in substantial magnetic noise if the sense current is above a certain level. It has been demonstrated that dual CPP MR sensor designs reduce the sensitivity of the free layer to spin-torque-induced instability.

In the dual CPP MR sensor of FIG. 6, the AF layer 124 is a first AF layer (AF1), the AP-pinned structure comprising layers 122, 123, 120 is a first AP-pinned structure (AP-pinned 1), and the spacer layer 130 is a first spacer layer. A second nonmagnetic spacer layer 230, like first spacer layer 130, is located on free layer 110. A second AP-pinned structure (AP-pinned 2), like AP-pinned 1, is located on second spacer layer 230. The AP2 reference layer 220 of AP-pinned 2 is in contact with second spacer layer 230. The AP1 layer 222 of AP-pinned 2 may have its magnetization direction pinned by being exchange-coupled to a second antiferromagnetic layer (AF2) 224. Alternatively, AP-pinned 2 may be "self-pinned" or AP1 of AP-pinned 2 may be pinned by a hard magnetic layer. Instead of being in contact with a hard magnetic layer, AP1 of AP-pinned 2 by itself can be comprised of hard magnetic material.

The single and dual CPP MR sensors described above and illustrated in FIGS. 4-6 may be CPP GMR sensors, in which case the nonmagnetic spacer layers 130, 230 would be formed of an electrically conducting material, typically a metal like Cu, Au or Ag. Alternatively, the single and dual CPP MR sensors may be CPP tunneling MR (CPP-TMR) sensors, in which case the nonmagnetic spacer layers 130, 230 would be tunnel barriers formed of an electrically insulating material, like $TiO_2$, MgO or $Al_2O_3$.

Figure 7:
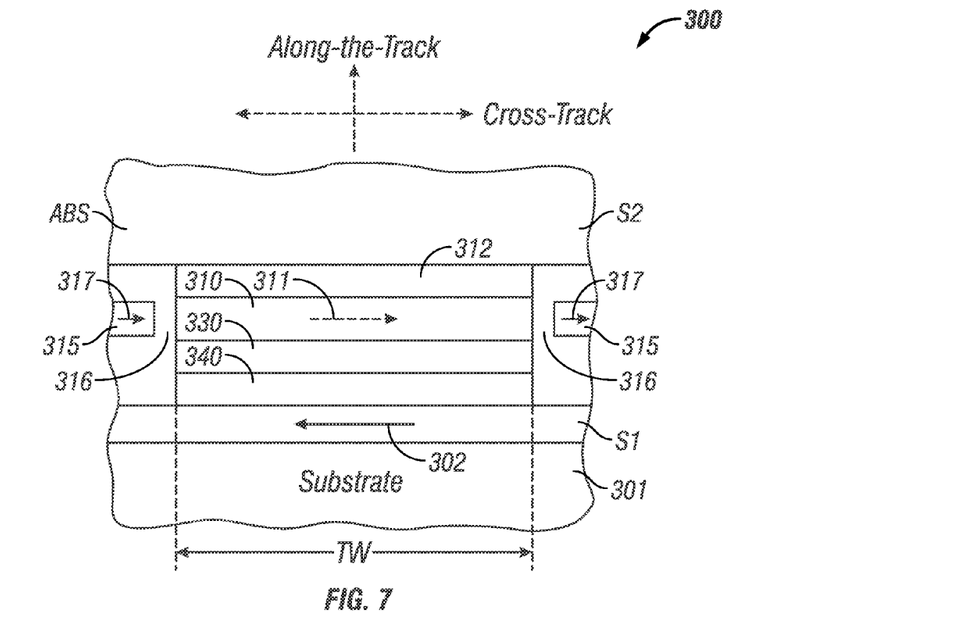
FIG. 7 is a cross sectional view of a single CPP MR sensor according to the invention showing the bottom shield layer with integrated reference layer.

This invention is a single or dual CPP-GMR or CPP-TMR sensor like that described above but wherein at least one of the shield layers also functions as the reference layer. The shield layer(s) with integrated reference layer may be formed of a magnetic material with high permeability, like any of the known materials for conventional read head magnetic shields, and may be deposited by electroplating. The material is preferably an alloy comprising Ni and Fe, wherein Ni is present in the alloy in an amount between 70 and 90 atomic percent. FIG. 7 is an enlarged sectional view showing the layers making up a single CPP MR sensor 300 according to the invention, as would be viewed from the disk. The sensor 300 is formed on a substrate 301, which may be the trailing surface of an air-bearing slider in a disk drive. The first shield layer S1 with integrated reference layer having a magnetization 302 is formed on substrate 301. Shield layer S1 with integrated reference layer and thus with a magnetization 302 may have similar dimensions to a conventional S1 shield layer. However, embodiments with smaller dimensions and elongated aspect ratios are preferred in order to improve the magnetic characteristics of the sensor. Thus, shield layer S1 may have a thickness in the range of about 40 to 300 nm in the along-the-track direction, which is substantially thinner than the conventional first shield S1 (FIGS. 4-6), which has a typical thickness in the range of about 1-3 µm. Shield layer S1 may also have a cross-track width in the range of about 100 to 750 nm, as compared to the width of a conventional first shield S1 of about 4-10 µm and to the sensor width TW of about 10-50 nm. Shield layer S1 may also have a "height" in the direction orthogonal to the ABS in the range of about 20 to 300 nm, as compared to the height of a conventional first shield S1 of about 2-5 µm and to the sensor height, referred to as the stripe height (SH) of about 10-100 nm. Also, the aspect ratio of the cross-track width to the height for S1 is preferably greater than 2, which provides additional stabilization of the magnetization 302 through magnetic shape anisotropy.

Figure 8:
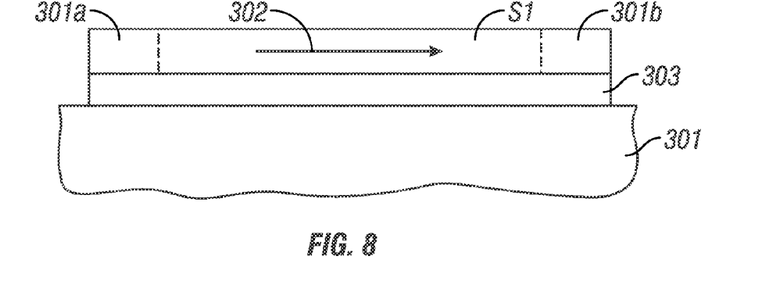
FIG. 8 is a cross sectional view of the bottom shield layer with integrated reference layer in the sensor of FIG. 7 exchange-coupled to an antiferromagnetic layer.

Shield layer S1 has a fixed magnetization 302 and thus also functions as the reference layer for the sensor 300, like reference layer 120 in FIG. 4. Shield layer S1 with integrated reference layer may have its magnetization 302 fixed by being exchange-coupled to an antiferromagnetic (AF) layer 303, as shown in FIG. 8. The AF layer 303 may be located below substantially the entire cross-track width of S1 or only in the end regions or tabs 301a, 301b. The AF layer 303 is typically a Mn alloy, e.g., PtMn, NiMn, FeMn, IrMn, PdMn, PtPdMn or RhMn.

Referring again to FIG. 7, the sensor 300 also includes a free ferromagnetic layer 310, nonmagnetic spacer layer 330 between free layer 310 and first shield S1, capping layer 312 and top or second shield S2, all of which may be formed of the same materials and have generally the same thicknesses as their counterparts described above with respect to FIGS. 4-6. The free layer 310 may include one or more layers formed of Co—Fe—Ni alloys, or alloys with high spin-polarization such as Heusler alloys of the type $Co_2MnZ$ or $Co_2FeZ$ where Z is one of Ge, Si, Al, or other alloys such as $(CoFe)_{1-x}Y_x$ where Y is one of Ge, Si, Al, Ga which are known to result in an enhanced MR in a CPP spin-valve structure.

Sensor 300 may also include an optional magnetic interface layer 340 between S1 and spacer layer 330. The magnetic interface layer 340 may be a CoFe alloy with a thickness between about 2-20 Å. The Fe concentration in atomic percent (at. %) is preferably between about 30-70 at. %, and preferably close to 50 at. %. The CoFe interface layer 340 improves magnetoresistance through higher interfacial scattering at the interface between the shield S1 and the nonmagnetic spacer layer 330. This is accomplished in two ways. First, because the nonmagnetic spacer layer 330 (typically Cu, Au, or Ag in a CPP-GMR sensor) would readily alloy with the NiFe in S1 if it was were in contact with S1, the interface layer 340 locates the spacer layer 330 material away from the S1 NiFe material. Second, CoFe has higher interfacial scattering with materials such as Cu than does NiFe.

The magnetic interface layer 340 may also be an alloy with high spin-polarization such as Heusler alloys of the type $Co_2MnZ$ or $Co_2FeZ$ where Z is one of Ge, Si, Al, or other alloys such as $(CoFe)_{1-x}Y_x$ where Y is one of Ge, Si, Al, Ga which are known to result in an enhanced MR in a CPP spin-valve structure.

Figure 9:
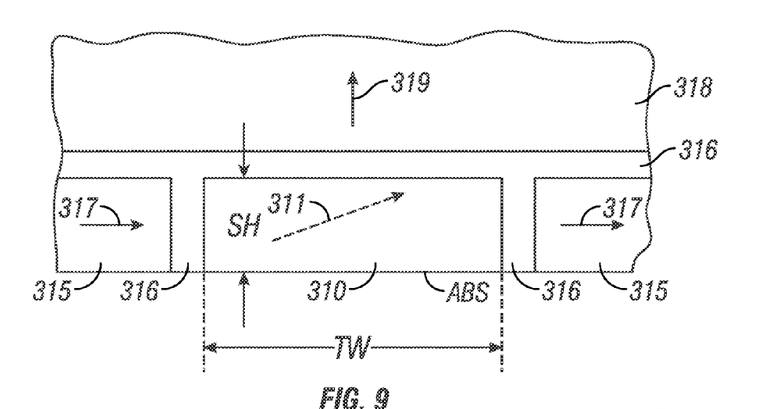
FIG. 9 is a sectional view of a plane orthogonal to the slider air-bearing surface (ABS) showing the biasing structure for the ferromagnetic free layer in the sensor of FIG. 7.

As shown in FIG. 7, shield S1 that functions as the reference layer has a fixed magnetization 302 oriented substantially parallel to the ABS. Thus the quiescent magnetization 311 of free layer 310 is oriented at an angle relative to magnetization 302, preferably between 120 and 150 degrees, to optimize the sensor response to magnetic fields from the recorded data bits on the disk. Thus it is necessary to bias the magnetization 311 in the desired direction. A portion of the biasing structure is shown in FIG. 7 by ferromagnetic side biasing layer 315 with magnetization 317 that is formed outside near the side edges of the free layer 310 and electrically insulated from free layer 310 by insulating regions 316. The complete biasing structure with free layer 310 is shown in FIG. 9, which is a view of a plane orthogonal to the ABS and shows the free layer with track width TW and height in a direction orthogonal to the ABS, referred to as the stripe height (SH). The complete biasing structure includes back biasing layer 318 that is recessed from the ABS and that has a magnetization 319 oriented generally orthogonal to the ABS and to the magnetization 317 of side biasing layer 315. Thus, in the absence of an external magnetic field, the biasing layers 315 and 319 together bias the magnetization 311 of free layer 310 generally at an angle of about 45 degrees from the ABS and 135 degrees from the magnetization 302 of S1 (FIG. 7). The ferromagnetic biasing layers 315, 319 may be hard magnetic bias layers like layers of CoPt or CoCrPt, or ferromagnetic layers that are exchange-coupled to antiferromagnetic layers. The biasing structure may also be a single layer wherein there is no insulating material between layers 315 and 319 and wherein the magnetization of the single layer is canted relative to the ABS to provide the desired direction for magnetization 311 of free layer 310. The biasing structure like that shown in FIG. 9 and the method for its fabrication are known in the art. U.S. Pat. No. 6,005,753, describes this type of biasing structure and its fabrication for a CPP-TMR read head.

Figure 10:
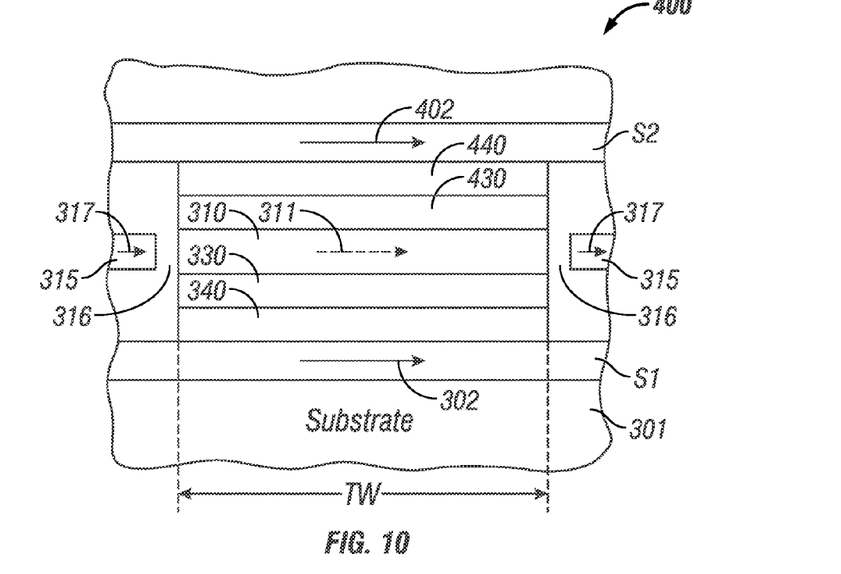
FIG. 10 is a cross sectional view of a dual CPP MR sensor according to the invention showing the bottom and top shield layers with integrated reference layers.

FIG. 10 is a sectional view showing the layers making up a dual CPP MR sensor 400 according to the invention based on the single CPP MR sensor of FIG. 7. Sensor 400 includes a top or second shield layer S2 with integrated second reference layer having a magnetization 402. Second shield layer S2 with magnetization 402 may be formed of the same materials and with substantially the same dimensions as first shield layer S1 with magnetization 401. Sensor 400 also includes second nonmagnetic spacer layer 430 on free layer 310 and optional second magnetic interface layer 440 between second spacer layer 430 and second shield layer S2. Optional second magnetic interface layer 440 has the same properties and functions in the same manner as optional first magnetic interface layer 340 described above.

The dual CPP MR sensor depicted in FIG. 10 has magnetizations 302, 402 of S1, S2, respectively, oriented parallel. In this embodiment the free layer 310 is a single free layer. However, the dual CPP MR sensor may alternatively have the magnetizations 302, 402 oriented antiparallel, in which case the free layer may be an APF structure as described above with respect to FIG. 5 to assure that the signals from the top and bottom portions of the sensor are added together.

This invention is applicable not only to single and dual CPP-GMR sensors but also to single and dual CPP tunneling MR (CPP-TMR) sensors. In a CPP-TMR sensor the spacer layers 330, 430 would be formed of an electrically insulating material, such as $TiO_2$, MgO or $Al_2O_3$.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor having a stack of layers and capable of sensing external magnetic fields from tracks on a magnetic recording disk when a sense current is applied perpendicular to the planes of the layers in the sensor, the sensor comprising:
a carrier having a disk-facing surface and a trailing surface generally orthogonal to said disk-facing surface;
a first shield layer formed of magnetically permeable material on said trailing surface, the first shield layer having a cross-track width and an in-plane magnetization direction fixed generally parallel to said disk-facing surface in the presence of the external magnetic field to be sensed;
one and only one free ferromagnetic layer having a cross-track width less than one-half the cross-track width of the first shield layer and an in-plane magnetization direction oriented at an angle relative to the magnetization direction of the first shield layer in the absence of an external magnetic field and being substantially free to rotate in the presence of the external magnetic field to be sensed;
a nonmagnetic spacer layer between the first shield layer and the free layer; and
a ferromagnetic biasing structure for biasing the magnetization direction of the free layer at said angle relative to the magnetization direction of the first shield layer in the absence of an external magnetic field, the biasing structure including a back biasing layer recessed from the disk-facing surface and having a magnetization direction generally orthogonal to the disk-facing surface.

2. The sensor of claim 1 wherein the first shield layer is formed of a NiFe alloy wherein Ni is present in said alloy in an amount between 70 and 90 atomic percent.

3. The sensor of claim 1 wherein the first shield layer has a thickness between 40 and 300 nm.

4. The sensor of claim 1 further comprising an antiferromagnetic layer between the carrier and the first shield layer for stabilizing the magnetization direction of the first shield layer.

5. The sensor of claim 1 further comprising a magnetic interface layer between the first shield layer and the nonmagnetic spacer layer.

6. The sensor of claim 5 wherein the magnetic interface layer comprises a CoFe alloy wherein Fe is present in said alloy in an amount greater than about 40 atomic percent and less than about 60 atomic percent.

7. The sensor of claim 5 wherein the magnetic interface layer comprises a material selected from a $Co_2MnZ$ Heusler alloy where Z is one of Ge, Si or Al, a $Co_2FeZ$ Heusler alloy where Z is one of Ge, Si or Al, and an alloy of $(CoFe)_{1-x}Y_x$ where Y is one of Ge, Si, Al or Ga.

8. The sensor of claim 1 wherein the magnetization direction of the free layer is oriented at an angle between 120 degrees and 150 degrees relative to the magnetization direction of the first shield layer in the absence of an external magnetic field.

9. The sensor of claim 1 further comprising a nonmagnetic capping layer on the free layer and a second shield layer of magnetically permeable material on the capping layer.

10. The sensor of claim 1 wherein the sensor is a giant magnetoresistance sensor and the nonmagnetic spacer layer is electrically conductive.

11. The sensor of claim 1 wherein the sensor is a tunneling sensor and the nonmagnetic spacer layer is electrically insulating.

12. A current-perpendicular-to-the-plane (CPP) magnetoresistive (MR) read head for reading magnetically recorded data from tracks on a magnetic recording disk in a disk drive, the head comprising:
an air-bearing slider having an air-bearing surface (ABS) for facing the disk and a trailing surface generally orthogonal to the ABS;
a first shield layer on the slider's trailing surface and formed of an alloy comprising Ni and Fe wherein Ni is present in said alloy in an amount between 70 and 90 atomic percent, the first shield layer having a width (W) in the cross-track direction and an in-plane magnetization direction fixed generally parallel to the ABS in the presence of magnetic fields from the magnetically recorded data on the disk;
a nonmagnetic spacer layer on the first shield layer;
one and only one free ferromagnetic layer on the spacer layer and having side edges defining a trackwidth (TW), wherein W is at least twice TW, the free layer having an in-plane magnetization direction oriented at an angle between 120 degrees and 150 degrees relative to the magnetization direction of the first shield layer in the absence of an external magnetic field and being substantially free to rotate in the presence of magnetic fields from the magnetically recorded data on the disk; and
a ferromagnetic biasing structure for biasing the magnetization direction of the free layer at said angle between 120 degrees and 150 degrees relative to the magnetization direction of the first shield layer in the absence of an external magnetic field, the biasing structure comprising side biasing layers adjacent the free layer side edges and having magnetization directions parallel to the ABS and a back biasing layer recessed from the ABS and having a magnetization direction generally orthogonal to the ABS.

13. The read head of claim 12 further comprising an antiferromagnetic layer between the trailing surface and the first shield layer for stabilizing the magnetization direction of the first shield layer.

14. The read head of claim 12 wherein the width of the first shield layer in the cross-track direction to the height of the first shield layer in a direction orthogonal to the ABS is greater than 2.

15. The read head of claim 14 wherein the width of the first shield layer in the cross-track direction is between 100 and 750 nm.

16. The read head of claim 14 wherein the height of the first shield layer in a direction orthogonal to the ABS is between 20 and 300 nm.

17. The read head of claim 12 wherein the first shield layer has a thickness between 40 and 300 nm.

18. The read head of claim 12 further comprising a magnetic interface layer between the first shield layer and the nonmagnetic spacer layer, the interface layer comprising a CoFe alloy wherein Fe is present in said CoFe alloy in an amount greater than about 40 atomic percent and less than about 60 atomic percent.

19. The read head of claim 12 further comprising a magnetic interface layer between the first shield layer and the nonmagnetic spacer layer, the magnetic interface layer comprising a material selected from a $Co_2MnZ$ Heusler alloy where Z is one of Ge, Si or Al, a $Co_2FeZ$ Heusler alloy where Z is one of Ge, Si or Al, and an alloy of $(CoFe)_{1-x}Y_x$ where Y is one of Ge, Si, Al or Ga.

20. The read head of claim 12 further comprising a nonmagnetic capping layer on the free layer and a second shield layer of magnetically permeable material on the capping layer, the second shield layer having a width in the cross-track direction at least twice TW and an in-plane magnetization direction fixed generally parallel to the ABS in the presence of magnetic fields from the magnetically recorded data on the disk.

21. The read head of claim 12 wherein the read head is a giant magnetoresistance sensor and the nonmagnetic spacer layer is electrically conductive.

22. The read head of claim 12 wherein the read head is a tunneling sensor and the nonmagnetic spacer layer is electrically insulating.

* * * * *